(12) United States Patent
Crabtree et al.

(10) Patent No.: US 6,582,137 B1
(45) Date of Patent: Jun. 24, 2003

(54) POLYIMIDE COATING PROCESS WITH DILUTE TMAH AND DI-WATER BACKRINSE

(75) Inventors: Mark J. Crabtree, Rocklin, CA (US); Joseph T. Siska, Roseville, CA (US)

(73) Assignee: NEC Electronics, Inc., Santa Clara, CA (US)

( * ) Notice: Subject to any disclaimer, the term of this patent is extended or adjusted under 35 U.S.C. 154(b) by 61 days.

(21) Appl. No.: 09/618,532

(22) Filed: Jul. 18, 2000

Related U.S. Application Data

(62) Division of application No. 09/368,562, filed on Aug. 5, 1999.

(51) Int. Cl.[7] ................................................. G03D 5/00
(52) U.S. Cl. .................... 396/604; 396/611; 118/52; 134/902; 427/240
(58) Field of Search ................. 396/604, 611, 396/626; 134/33, 902; 118/52, 54, 56, 319–321, 666–668, 716; 427/240

(56) References Cited

U.S. PATENT DOCUMENTS

| | | | | |
|---|---|---|---|---|
| 5,238,878 A | * | 8/1993 | Shinohara | ..................... 134/33 |
| 5,893,004 A | * | 4/1999 | Yamamura | ..................... 118/52 |
| 6,203,218 B1 | * | 3/2001 | Omori et al. | ............... 396/611 |

FOREIGN PATENT DOCUMENTS

| | | | |
|---|---|---|---|
| JP | 58-98733 | * | 6/1983 |
| JP | 63-134076 | * | 6/1988 |
| JP | 2-134820 | * | 5/1990 |
| JP | 3-256321 | * | 11/1991 |
| JP | 7-183208 | * | 7/1995 |
| JP | 10-41206 | * | 2/1998 |
| JP | 2001-68393 | * | 3/2001 |

* cited by examiner

*Primary Examiner*—D Rutledge
(74) *Attorney, Agent, or Firm*—Campbell Stephenson Ascolese LLP

(57) ABSTRACT

An apparatus is disclosed for coating a semiconductor wafer with polyimide so that excess polyimide is removed from the wafer edge, back side and coating process area and is conveniently drained. A developer, such as dilute TMAH, that mixes with the excess polyimide is injected into a chamber. The soluble mixture of TMAH and excess polyimide may then be drained into a bulk drain, obviating the accumulation of excess polymide in the coater cup. The method is implemented through an assembly that includes a coater cup, spin chuck disposed within the coater cup, and a pair of nozzles intruding into the coater cup at a lower portion of the cup. A fist nozzle operates to inject developing fluid onto the back side of the wafer in the cup, and a second nozzle, positioned nearer the center of the cup and the spin chuck, operates to inject rinsing fluid.

9 Claims, 1 Drawing Sheet

POLYIMIDE COATING PROCESS WITH DILUTE TMAH AND DI-WATER BACKRINSE

CROSS-REFERENCE TO RELATED APPLICATION

This Patent Application is a divisional of, and claims benefit of the same filing date as, U.S. patent application Ser. No. 09/368,562, filed Aug. 5, 1999, and titled "Polyimide Coating Process With Dilute TMAH and DI-Water Backrinse," on behalf of the same inventors as this Application.

BACKGROUND OF THE INVENTION

1. Field of the Invention

The invention relates to semiconductor device fabrication and, more particularly, to a method and apparatus for imparting a coating material to the surface of a semiconductor wafer and for efficiently removing excess amounts of the coating material and preventing excess coating material from adhering to the edges and back side of the wafer once the wafer has been coated.

2. Description of the Related Art

As is well known to those experienced in the art of semiconductor device fabrication, polyimide films have proven useful for a number of purposes, particularly for planarization of the semiconductor device surface in anticipation of photolithographic patterning and a passivation stress buffer. Polyimide films, which consist of polyimide resins in a solvent such as NMP (n-methyl-2-pyrolidone), demonstrate excellent thermal stability and chemical resistance, as well as acceptable dielectric properties. Consequently, polyimide films can be left permanently in place on the device, and are often used as a substitute for $SiO_2$ or PSG (phososilicate glass) layers. The films can be applied in layers on the order of 1 to 40 $\mu$m thickness by conventional photoresist spinning techniques. Upon application, polyimide films flow around projections and steps in the device surface, thereby contributing to planarization. The film contour becomes permanent upon curing at about 300° C. In use, the degree of planarization effected by polyimide coating may be controlled by the viscosity of the film, that is, by the ratio of resin to solvent, and by the film thickness.

In a conventional semiconductor device fabrication process, a polyimide coating step takes place in a coater spin cup. The semiconductor wafer is supported inside the cup by a spin chuck. A dollop of polyimide is dispensed on the top surface of the wafer, and the wafer is rotated through rotation of the spin chuck shaft, while the coater spin cup remains essentially stationary. As the wafer rotates, polyimide is more or less uniformly dispensed over the surface of the wafer, with excess polyimide material centrifugally expelled off the circumferential perimeter of the wafer. The wafer then is subjected to a backrinse with a solvent such as propylene glycol monomethyl ether acetate (PGMEA). As an undesired side effect of the coating process, excess polyimide material is deposited on the edges of the wafer and accumulates in the coater spin cup, thereby requiring cups to be periodically changed out after, approximately, 100 to 150 coating steps. In addition, because polyimide mixed with PGMEA results in a viscous fluid that cannot be piped into a bulk drain, the polyimide must be evacuated to a waste drain tank.

Accordingly, what is desired is an improved polyimide coating step in a semiconductor device fabrication process, wherein the improved step mitigates the need for frequent changes in the coater spin cup, removes wafer-edge and back side deposits and provides more efficient and convenient disposal of excess polyimide.

SUMMARY OF THE INVENTION

The above and other objects, advantages and capabilities are realized in one aspect of the invention by a method of coating a semiconductor wafer that is characterized by respective first and second substantially planar surfaces. The wafer is supported in a coater cup by a spin chuck that is disposed at or near the center of the first surface. After a coating material is deposited over at least a portion of the second surface, the wafer is spun, via rotation of the spin chuck shaft, so as to distribute the coating material over remaining portions of the second surface, and thereby cause excess coating material to be centrifugally expelled from the perimeter of the wafer. A developing fluid is injected on the back side of the wafer and is also centrifugally expelled off the wafer into the coater cup so that the excess coating material mixes with the developing fluid. Subsequently, a rinsing fluid is injected into the cup at a position proximal to the first surface so that developing fluid may be rinsed from the first surface. In a preferred embodiment of the invention, the coating material is polyimide, the developing fluid is dilute tetramethyl ammonium hydroxide (TMAH), and the rinsing fluid is DI water.

Another aspect of the invention is realized by an apparatus for coating a first surface of a semiconductor wafer. The apparatus includes a coater cup in which is disposed a spin chuck consisting essentially of a platen portion for supporting the semiconductor wafer at the center of the second surface and a shaft portion extending downwardly from the platen through the bottom of, but separate from, the coater cup. The apparatus also includes first and second nozzles, extending into the coater cup through the bottom portion, for respectively injecting a rinsing fluid and a developing fluid into the coater cup at predetermined intervals.

BRIEF DESCRIPTION OF THE DRAWINGS

The present invention may be better understood, and its numerous objects, features, and advantages made apparent to those skilled in the art by referencing the accompanying drawings.

FIG. 1, including

The use of the same reference symbols in different drawings indicates similar or identical items.

DESCRIPTION OF THE PREFERRED EMBODIMENT(S)

For a thorough understanding of the subject invention, reference is made to the following Description, including the appended Claims, in connection with the above-described Drawings.

Figure 1A:
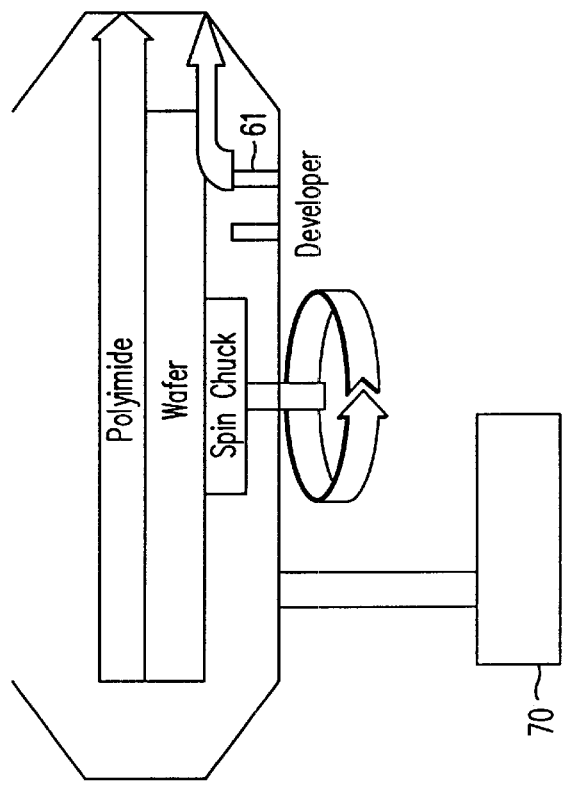
FIGS. 1A through 1D, depicts the salient steps of, and apparatus for implementing, the subject invention.

Referring now to FIG. 1, and, more specifically, FIG. 1A, the invention is there seen to be implemented through the use of a coater spin cup 10 in which there is positioned an associated spin chuck assembly 20. Spin chuck 20 consists primarily of a typically circular platen portion 21 that is attached, or otherwise rendered integral to, a shaft 22. As seen in FIG. 1, shaft 22 extends substantially orthogonally from approximately the center of platen 21, through a bottom surface 11 of coater spin cup 10. The spin chuck, of course, is used to support a semiconductor wafer 30. In a conventional semiconductor fabrication process, a dollop of polyimide 40 is dispensed on the upper surface 31 of the wafer, at approximately the center thereof, by a dispense nozzle 50.

Figure 1B:
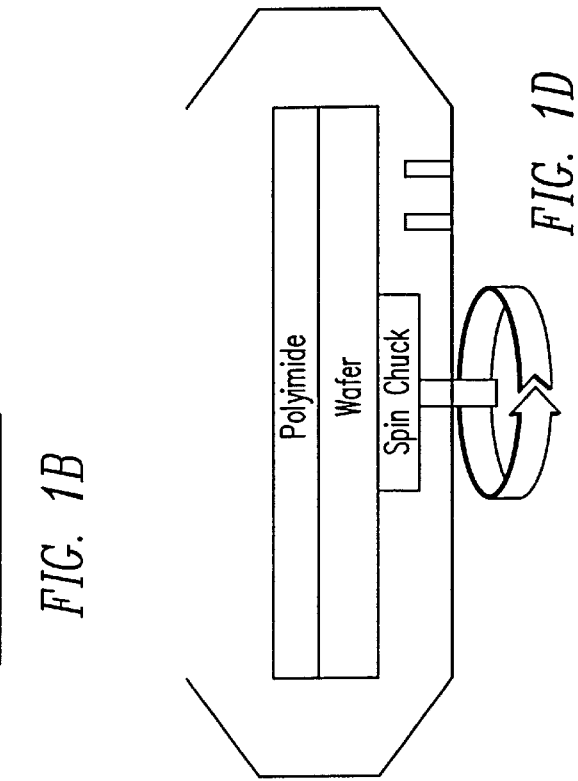

As shown in FIG. 1B, rotation of shaft 22 causes the wafer to likewise rotate and the polyimide to be spread, by centrifugal action, evenly across surface 31 of the wafer. Excess polyimide is expelled from the circumference of the wafer and, but for the subject invention, tends to settle and accumulate in the bottom of spin cup 10 and coat the wafer edge and back side.

However, as depicted in FIG. 1B, the invention obviates the accumulation of polyimide on the edge and back side of the wafer and in the coater cup by injecting a developing fluid through a first nozzle 61 as the excess polyimide is expelled from the perimeter of the wafer. Injection of developing fluid as a backrinse is a substitute for and, as will be more fully articulated below, an improvement over PGMEA backrinse as has been heretofore applied. In the preferred embodiment of the invention, the developer fluid consists essentially of dilute (2.38%) tetramethylammonium hydroxide (TMAH). The dilute TMAH dissolves the excess polyimide and the polyimide/TMAH mixture is drained into a bulk drain system (not shown), thereby removing and preventing the excess polyimide from being deposited on the edge and back side of the wafer. In a preferred mode presently contemplated by the inventors, the dilute TMAH is dispensed on the back side of the wafer at a flow rate of approximately 150 mL/minute, for a duration of twenty seconds. The dilute TMAH serves as a back rinse to remove polyimide from surface 32 of the semiconductor device.

Figure 1C:
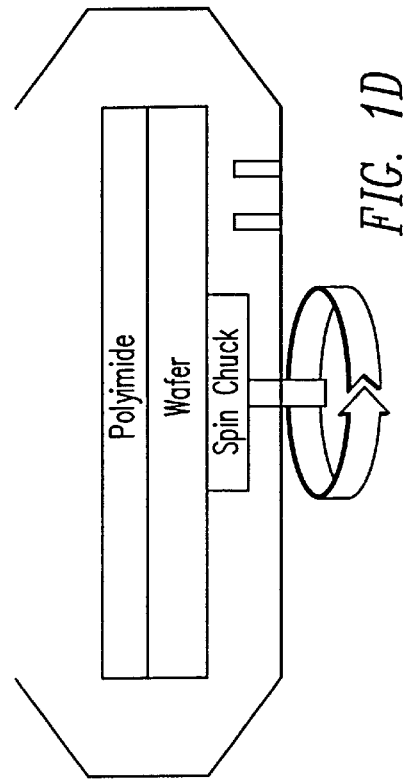

As the penultimate phase of the process step, shown in FIG. 1C, subsequent to the injection of dilute TMAH, DI water is injected onto the backside 32 of the wafer through a second nozzle 62. The injection of DI water serves as a backrinse to remove TMAH from surface 32 of the semiconductor wafer. In order to enhance the effectiveness of the DI water backrinse, nozzle 62 is positioned within the coater chamber nearer the spin chuck (that is, nearer the axis of rotation of shaft 22 and the center of semiconductor wafer 30) than is nozzle 61.

Figure 1D:
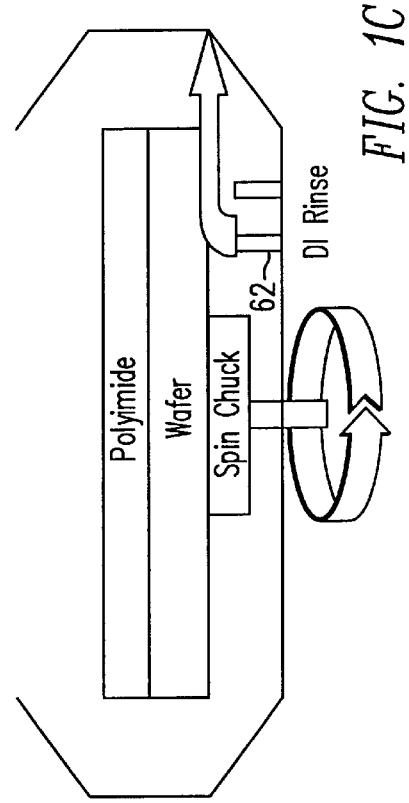

As the final phase of the spin coating process step, depicted in FIG. 1D, both the TMAH backrinse and DI water backrinse are turned off, and the wafer is spun dry.

As noted above, a primary advantage associated with the TMAH backrinse, as opposed to the former use of PGMEA, is the significant reduction in the frequency with which coater spin cups need to be replaced due to polyimide accumulation. In fact, with TMAH and DI water backrinse, coater spin cups have been empirically found to remain acceptably clean after as many as 1000 spin coating steps. Another significant advantage is the ability to pipe the dissolved polyimide to a bulk drain, and efficiently remove polyimide from the wafer edge and back side 32, rather than to a waste drain tank. Other advantages are also notable. To wit:

(a) TMAH developer is less expensive than PGMEA.
(b) PGMEA is supplied in canister containment, and the canisters are required to be replaced at approximately eight-hour intervals, thereby causing costly production downtime. TMAH is available in bulk.
(c) PGMEA exhibits a pungent odor that is objectionable even in concentrations as low as 10 ppm. Consequently even small spills, less than 5 cm$^3$, or leaks during canister change may require evacuation of the fabrication room. Evacuation is necessary also when PGMEA that has accumulated in the coater cup is drawn off as a liquid into an exhaust box.

Although the subject invention has been described above with reference to a particular, preferred, embodiment, it is to be understood that various additions, deletions, and modifications to the embodiment described may be implemented by those with ordinary skill in the art, and such additions, deletions, and modifications will not depart from the scope of the invention, as defined by the appended claims.

What is claimed is:

1. An apparatus for imparting a coating to a first surface of a semiconductor wafer, the apparatus comprising:
    a coater cup having a bottom portion;
    a spin chuck disposed within the coater cup, for supporting the semiconductor wafer and imparting rotational motion to the wafer;
    a first nozzle extending into the coater cup through the bottom portion for injecting a developing fluid onto the back side of the wafer in the coater cup; and
    a second nozzle extending into the coater cup through the bottom portion for injecting a rinsing fluid onto the back side of the wafer in the coater cup, wherein the first nozzle and the second nozzle are perpendicular to the semiconductor wafer.

2. An apparatus as defined in claim 1 wherein the spin chuck comprises a platen portion for supporting the semiconductor wafer at a second surface and comprises a shaft portion extending in a substantially normal orientation from the platen portion through the bottom portion of the coater cup.

3. An apparatus as defined in claim 2 wherein the first nozzle and the second nozzle each extend into the coater cup through the bottom portion of the coater cup and wherein the second nozzle is positioned nearer the shaft portion than is the first nozzle.

4. An apparatus as defined in claim 3 wherein the second nozzle operates to inject rinsing fluid after the first nozzle becomes operable to inject developing fluid.

5. An apparatus for imparting a coating to a first surface of a semiconductor wafer, the apparatus comprising:
    a coater cup having a bottom portion;
    a spin chuck disposed within the coater cup, for supporting the semiconductor wafer and imparting rotational motion to the wafer, wherein the spin chuck comprises a platen portion for supporting the semiconductor wafer at a second surface and comprises a shaft portion extending in a substantially normal orientation from the platen portion through the bottom portion of the coater cup;
    a first nozzle extending into the coater cup through the bottom portion for injecting a developing fluid onto the back side of the wafer in the coater cup; and
    a second nozzle extending into the coater cup through the bottom portion for injecting a rinsing fluid onto the back side of the wafer in the coater cup, wherein the first nozzle and the second nozzle each extend into the coater cup through the bottom portion of the coater cup and wherein the second nozzle is positioned nearer the shaft portion than is the first nozzle.

6. An apparatus as defined in claim 5 wherein the second nozzle operates to inject rinsing fluid after the first nozzle becomes operable to inject developing fluid.

7. An apparatus for imparting a coating to a first surface of a semiconductor wafer, the apparatus comprising:
    a coater cup having a bottom portion;

a spin chuck disposed within the coater cup, for supporting the semiconductor wafer and imparting rotational motion to the wafer;

a first nozzle extender into the coater cup through the bottom portion for injecting a rinsing fluid onto the back side of the wafer in the coater cup;

a second nozzle extending into the coater cup through the bottom portion for injecting a rinsing fluid onto the back side of the wafer in the coater cup; and a bulk drain connected to the coater cup for collecting a mixture comprising excess coating and the developing fluid.

8. An apparatus as defined in claim 7 wherein the developing fluid is diluted tetramethyl ammonium hydroxide (TMAH).

9. An apparatus as defined in claim 7 wherein a pipe connects the bulk drain to the coater cup.

* * * * *